(12) United States Patent
Sano

(10) Patent No.: US 8,748,841 B2
(45) Date of Patent: Jun. 10, 2014

(54) DRAWING APPARATUS AND METHOD OF MANUFACTURING ARTICLE

(75) Inventor: Kentaro Sano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/471,309

(22) Filed: May 14, 2012

(65) Prior Publication Data

US 2012/0295202 A1    Nov. 22, 2012

(30) Foreign Application Priority Data

May 16, 2011    (JP) .................................. 2011-109448

(51) Int. Cl.
*G21K 5/04*    (2006.01)

(52) U.S. Cl.
USPC .................... 250/396 R; 250/397; 250/492.1; 250/492.3

(58) Field of Classification Search
USPC ................. 250/492.1, 492.2, 492.21, 492.22, 250/492.3, 396 R, 397, 398, 396 ML
See application file for complete search history.

(56) References Cited

U.S. PATENT DOCUMENTS

| 2007/0111116 A1* | 5/2007 | Noudo et al. .................... 430/22 |
| 2012/0241641 A1* | 9/2012 | Sano et al. ................. 250/396 R |

FOREIGN PATENT DOCUMENTS

| JP | 9007538 A | 1/1997 |
| JP | 2006-080155 A | 3/2006 |
| JP | 3803105 B2 | 8/2006 |
| TW | I227483 B | 2/2005 |

\* cited by examiner

*Primary Examiner* — Nicole Ippolito
(74) *Attorney, Agent, or Firm* — Canon U.S.A., Inc. IP Division

(57) ABSTRACT

A drawing apparatus includes a first aperture array configured to split a diverging charged particle beam, a converging lens array configured to form a plurality of first crossovers of a plurality of charged particle beams from the first aperture array, a collimator lens having a principal plane where the plurality of first crossovers are to be formed, a correcting system configured to correct angles of a plurality of charged particle beams from the collimator lens and to form a plurality of second crossovers, and an element having a plurality of apertures respectively corresponding to the plurality of second crossovers. The first aperture array and the converging lens array have apertures such that an arrangement of the plurality of first crossovers is different from an arrangement of the plurality of apertures, and that the plurality of second crossovers are aligned with the plurality of apertures on the element.

13 Claims, 12 Drawing Sheets

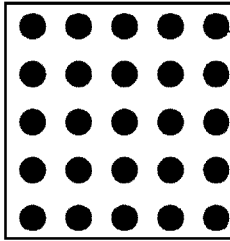

FIG. 2A PRE-APERTURE ARRAY

FIG. 2B PRE-CONVERGING LENS ARRAY

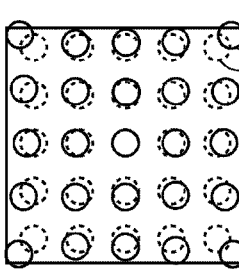

FIG. 2C CROSSOVERS FORMED ON REFRACTIVE SURFACE 114

FIG. 2D SECOND APERTURE ARRAY AND CORRECTION LENS ARRAY

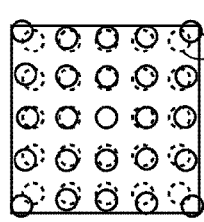

FIG. 2E MAGNIFYING LENS ARRAY

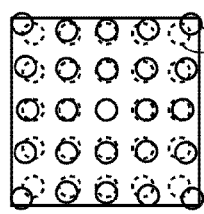

FIG. 2F CROSSOVERS FORMED ON STOP APERTURE ARRAY 133

APERTURE ARRANGEMENT OF EACH DEVICE (UNFILLED CIRCLE) AND BEAM ARRANGEMENT OF INTERMEDIATE IMAGING PLANE (FILLED CIRCLE) (DOTTED LINES SHOW APERTURE ARRANGEMENT IN CASE WHERE IRRADIATION SYSTEM HAS NO ABERRATION)

APERTURE ARRANGEMENTS
OF APERTURE ARRAY AND
CONVERGING LENS ARRAY

CROSSOVERS
FORMED ON STOP
APERTURE ARRAY 133

FIG.5A
APERTURE ARRANGEMENTS OF APERTURE ARRAY AND CORRECTION LENS ARRAY IN CASE WHERE DEFOCUS ADJUSTMENT IS NOT MADE

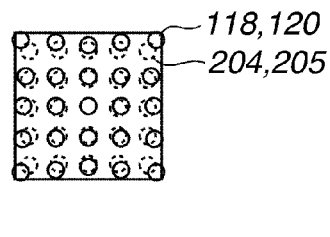

FIG.5B
APERTURE ARRANGEMENTS OF APERTURE ARRAY AND CORRECTION LENS ARRAY IN CASE WHERE DEFOCUS ADJUSTMENT IS MADE

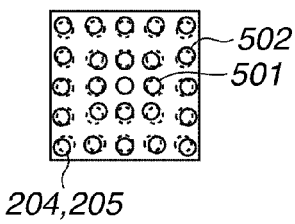

FIG.5C

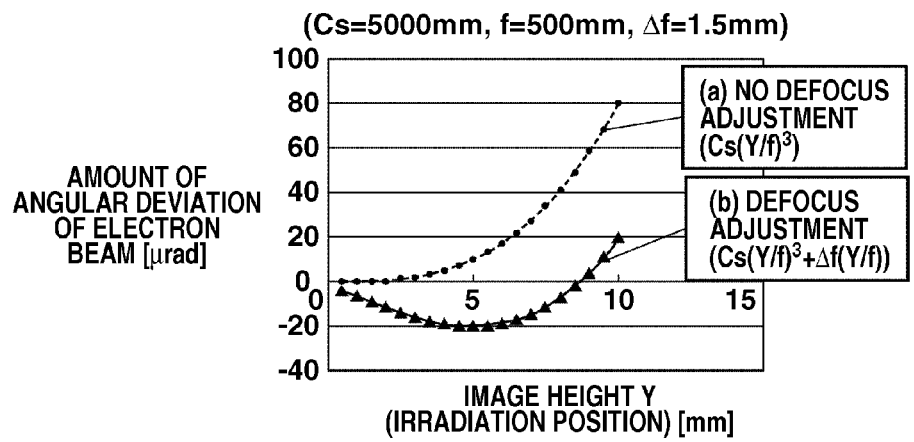

$Cs = Cs(CL) + Cs(Coulomb)$ $Cs(CL)$: SPHERICAL ABERRATION COEFFICIENT (POSITIVE) OF COLLIMATOR LENS
$Cs(Coulomb)$: SPHERICAL ABERRATION COEFFICIENT (NEGATIVE) OF SPACE-CHARGE EFFECT

ONE-STAGE LENS CONFIGURATION (DISTANCE BETWEEN APERTURES AND CORRECTION LENS IS LONG)

TWO-STAGE LENS CONFIGURATION (DISTANCE BETWEEN APERTURES AND CORRECTION LENS IS SHORT)

FIG.10A FIG.10B
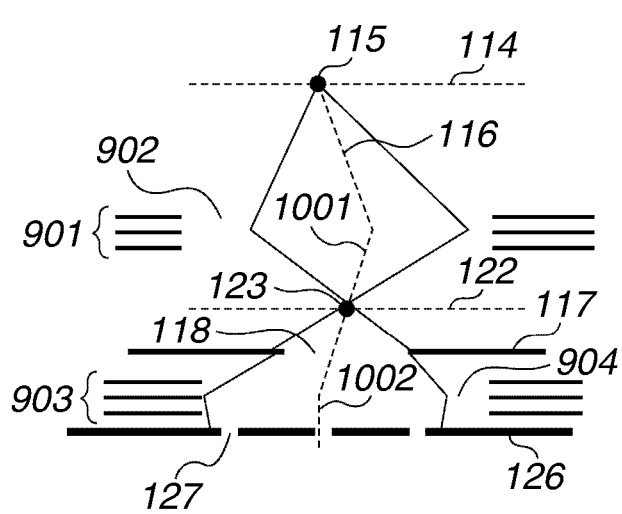
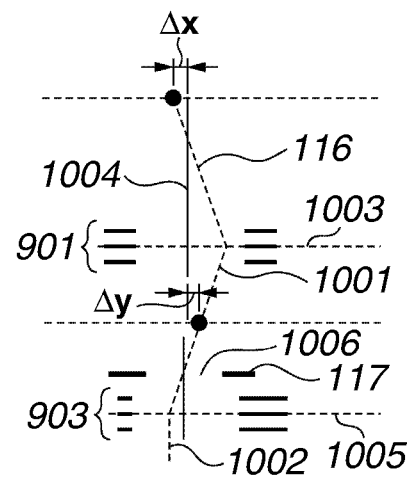

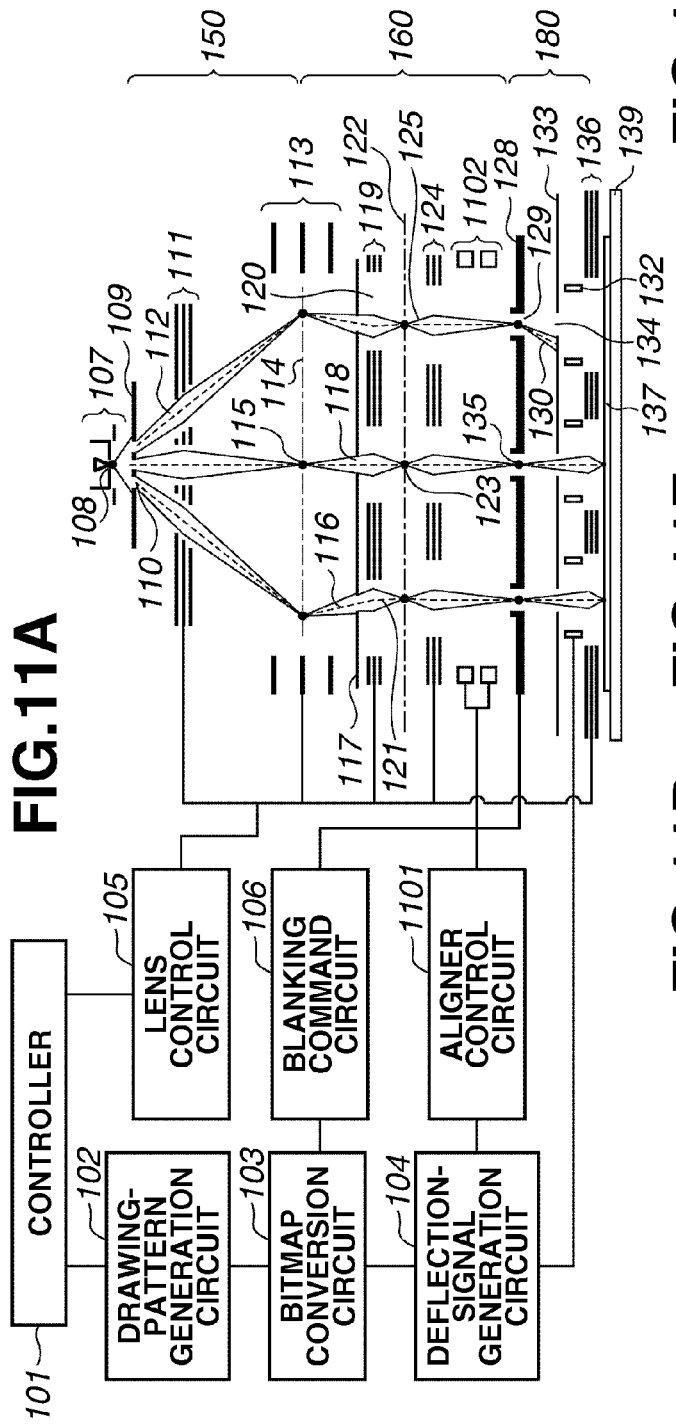
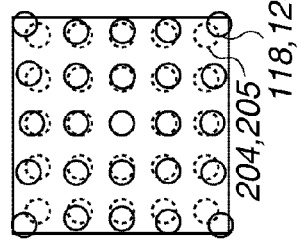
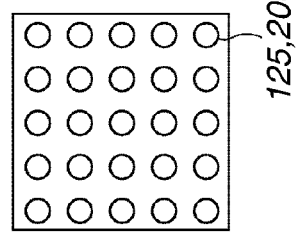
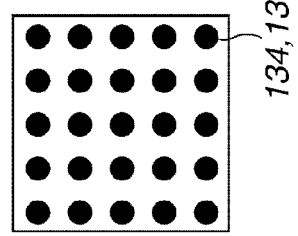
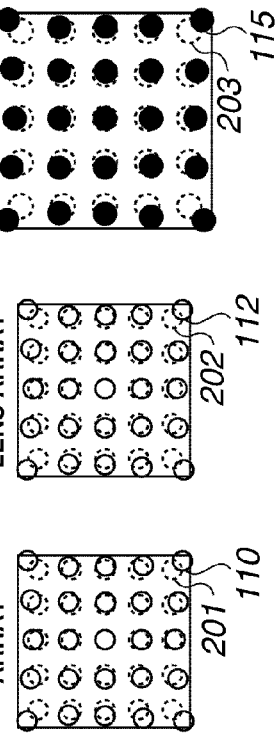

DRAWING APPARATUS AND METHOD OF MANUFACTURING ARTICLE

BACKGROUND OF THE INVENTION

1. Field of the Invention

Embodiments of the present invention relate to a drawing apparatus configured to perform drawing on a substrate with a plurality of charged particle beams.

2. Description of the Related Art

As such a drawing apparatus, there is a known multi-column drawing apparatus having a projection unit for each charged particle beam (Japanese Patent Application Laid-Open No. 09-007538). Since each projection unit is separately provided, the drawing apparatus does not have a crossover where all of a plurality of charged particle beams are converged in a projection system. Therefore, space-charge effect (Coulomb effect) is not much affected, and thus it can be said that the drawing apparatus is advantageous in increasing the number of charged particle beams.

However, in order to increase the number of charged particle beams in the multi-column drawing apparatus, generally, it is necessary to increase a divergence angle (divergence half angle) of a charged particle beam from a charged particle source in an irradiation optical system which is in front of the plurality of projection units. If the divergence angle of the charged particle beam from the charged particle source becomes large, it is difficult to sufficiently parallelize beams irradiated onto the plurality of projection units due to aberration in an irradiation optical system, and thus irradiation angles (incident angles) become non-uniform. The non-uniformity of the irradiation angles results in non-uniformity in characteristic among the plurality of charged particle beams. Although there has been known issues related to aberration of a projection optical system and configurations for compensating for the aberration, issues related to aberration of an irradiation optical system as mentioned above were uniquely recognized by the inventor of the present invention.

SUMMARY OF THE INVENTION

The present invention is directed to, for example, a drawing apparatus which is advantageous in compensating for non-uniformity among a plurality of charged particle beams.

According to an aspect of the present invention, a drawing apparatus configured to perform drawing on a substrate with a plurality of charged particle beams includes a first aperture array configured to split a diverging charged particle beam into a plurality of charged particle beams, a converging lens array configured to form a plurality of first crossovers of the plurality of charged particle beams from the first aperture array, a collimator lens having a principal plane where the plurality of first crossovers is to be formed, a correcting system configured to correct angles of a plurality of charged particle beams from the collimator lens, and to form a plurality of second crossovers, and an element having a plurality of apertures respectively corresponding to the plurality of second crossovers. In the drawing apparatus, the first aperture array and the converging lens array have apertures such that an arrangement of the plurality of first crossovers on the principal plane is different from an arrangement of the plurality of apertures, and that the plurality of second crossovers are aligned with the plurality of apertures on the element.

According to an exemplary embodiment of the present invention, it is possible to provide a drawing apparatus which is advantageous in terms of uniformity in characteristic among a plurality of charged particle beams, for example, even if including an irradiation optical system having non-uniform irradiation angles.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 2A, 2B, 2C, 2D, 2E, and 2F are diagrams illustrating aperture arrangements of a pre-aperture array, a pre-converging lens array, a second aperture array, a correction lens array, and a magnifying lens array, an arrangement of crossovers formed on a refracting surface, and an arrangement of crossovers formed in a stop aperture array.

FIGS. 5A, 5B, and 5C are diagrams illustrating a difference in aperture arrangements of the aperture array and the converging lens array between a case where defocus adjustment of a collimator lens is made and a case where defocus adjustment of the collimator lens is not made.

FIGS. 10A and 10B are diagrams illustrating configurations in which a principal ray of charged particle beams is refracted in two stages by tandem lens arrays.

FIGS. 11A, 11B, 11C, 11D, 11E, 11F, and 11G are diagrams illustrating a configuration of a drawing apparatus according to a fifth exemplary embodiment.

DESCRIPTION OF THE EMBODIMENTS

Various exemplary embodiments, features, and aspects of the invention will be described in detail below with reference to the drawings.

Figure 1:
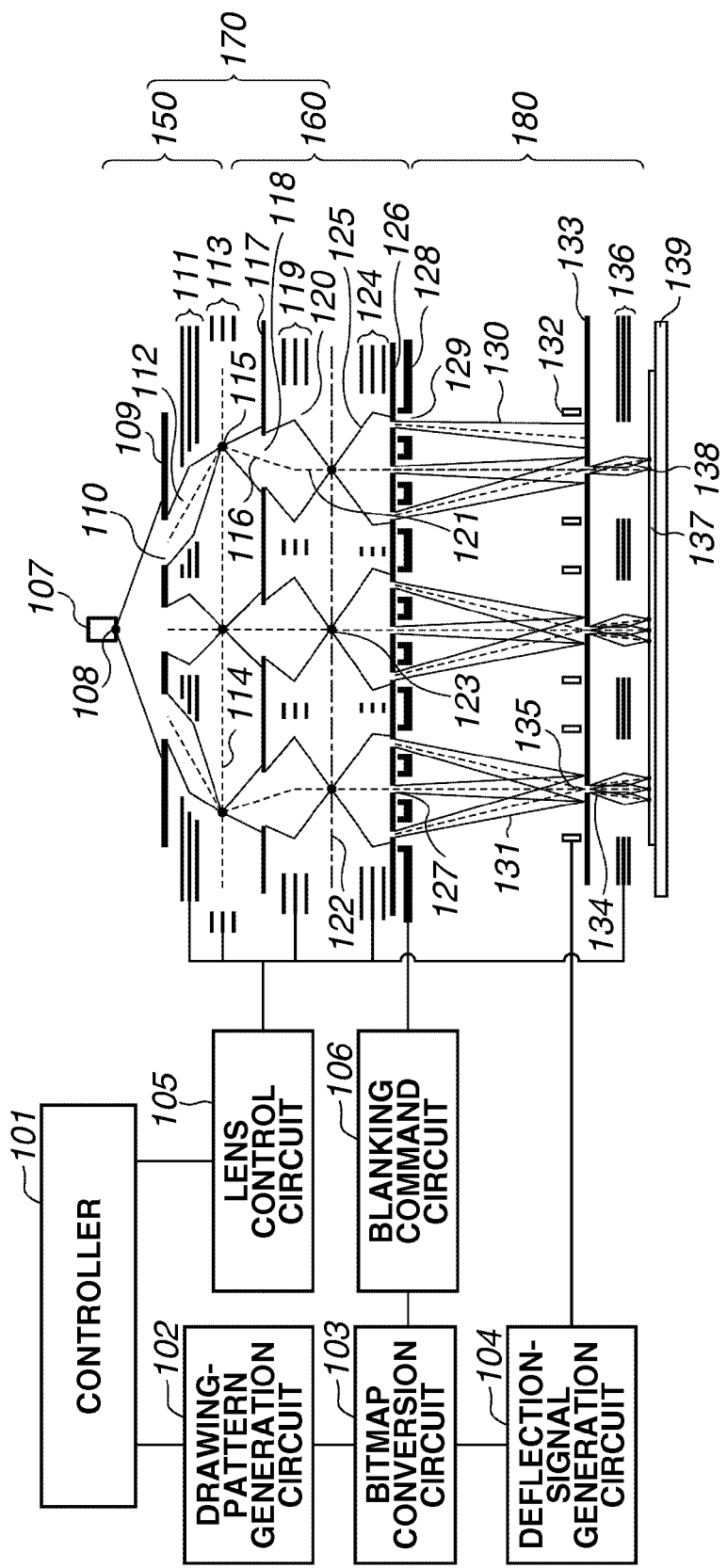
FIG. 1 is a diagram illustrating a configuration of a drawing apparatus according to a first exemplary embodiment.

FIG. 1 is a diagram illustrating a configuration of a drawing apparatus (a drawing apparatus configured to perform drawing on a substrate with a plurality of charged particle beams) according to a first exemplary embodiment. The drawing apparatus of the present exemplary embodiment is configured as a multi-column drawing apparatus including one projection unit for each charged particle beam. Throughout all exemplary embodiments, examples using electron rays (electron beams) as charged particle beams will be described. However, the present invention is not limited thereto, but other charged particle beams such as ion beams may be used.

An electron beam diverging at a wide radiation angle from an electron source 107 is split into multiple electron beams by a pre-aperture array 109 (a first aperture array). Here, as the electron source 107, a thermionic-type electron source such as LaB6 or BaO/W (dispenser cathode) is useful. Further, as for a shape of a cathode, a flat cathode implementing high emittance is useful. A flat-cathode-type electron gun can define a virtual crossover 108, and it can be considered that a virtual light source (secondary light source) is at the position of the virtual crossover 108.

The multiple electron beams emitted from the pre-aperture array 109 are converged by a pre-converging lens array 111 (converging lens array) to form a plurality of crossovers. Here, the pre-converging lens array 111 may be an einzel-type electrostatic-lens array that is composed of three electrodes which includes an intermediate electrode configured to receive a negative voltage and upper and lower electrodes configured to be grounded. Further, aperture arrangements of the three electrodes of the pre-converging lens array are different from one another such that each of principal rays of the multiple electron beams passes through the center of each of three apertures. If these aperture arrangements are used, it is possible to reduce off-axis aberration of outer converging lenses of the pre-converging lens array 111.

On the rear side of the pre-converging lens array, there is disposed a collimator lens 113 configured to refract the principal rays of the multiple electron beams such that the principal rays are parallelized. Here, the collimator lens 113 may also be an einzel-type electrostatic lens. The collimator lens 113 is disposed such that a front principal plane of the collimator lens 113 coincides with each of crossovers formed by the pre-converging lens array 111. Here, the term "coincidence" includes a case where the front principal plane deviates from each of crossovers within an allowable range set from accuracy required of the drawing apparatus. The term "coincidence" in the following description is also used in the same meaning as that.

The light fluxes of multiple electron beams having the principal rays parallelized by a refracting surface 114 of the collimator lens 113 are defined by a second aperture array 117. Then, the multiple electron beams are converged again by a correction lens array 119. Here, the second aperture array 117 is disposed so as to coincide with a front focal plane of the correction lens array 119, and defines light fluxes passing through a pupil plane of the correction lens array 119. The function of the correction lens array 119 is to correct angle deviations of the principal rays of the multiple electron beams due to spherical aberration of the collimator lens 113 or space-charge effect. The function of the correction lens array 119 will be described below in detail.

After the angle deviations of the principal rays of the multiple electron beams are corrected by the correction lens array 119, the multiple electron beams are converged again by a magnifying lens array 124. Here, the lens power of the magnifying lens array is set such that the multiple electron beams are converged onto a rear-side stop aperture array 133 (blanking stop aperture array). The multiple electron beams pass through the magnifying lens array 124, and then immediately are further split into multiple sub electron beams 131 by a projection aperture array 126. FIG. 1 illustrates a case where each electron beam is split into multiple (3-by-3) sub electron beams (a set of groups of multiple sub electron beams).

Since the lens power of the magnifying lens array 124 is set as described above, the multiple sub electron beams are converged onto the stop aperture array 133. Here, the stop aperture array 133 includes one aperture for each group of multiple sub electron beams of the set. The arrangement of apertures 134 of the stop aperture array coincides with the arrangement of apertures of the centers of the 3-by-3 aperture groups of the projection aperture array 126 corresponding to the groups of multiple sub electron beams of the set.

Directly below the projection aperture array 126, a blanker array 128 (blanking deflector array) is provided. The blanker array includes deflectors (including pairs of electrodes) configured to deflect electron beams, and performs a blanking operation on each electron beam. If a voltage is applied to one pair of electrodes of the blanker array 128, a corresponding electron beam is deflected and is blocked by the stop aperture array 133, resulting in a blanking state. An electron beam 130 deflected by the blanker array 128 is illustrated in FIG. 1.

The multiple sub electron beams having passed through the stop aperture array 133 are converged by an objective lens array 136 to form an image on the surface of a wafer 137 (to form crossovers). An object plane of the objective lens array 136 is configured to coincide with the projection aperture array 126. Therefore, the 3-by-3 aperture pattern of the projection aperture array 126 is reduced and projected onto the wafer 137. In a case where the diameter of one aperture of the projection aperture array 126 is set to 2.5 μm, and the projection magnification of the objective lens array 136 is set to 1/100 times, the diameter of one electron beam reduced and projected onto the wafer 137 becomes 25 nm.

The stop aperture array 133 is disposed on a front focal plane of the objective lens array 136, and defines light fluxes passing through a pupil plane of the objective lens array 136. Further, a deflector array 132 is disposed in the vicinity of the stop aperture array 133, and can perform electron beam scanning in a unit of one set of a group of multiple sub electron beams. The deflector array 132 is configured by a pair of comb-teeth-shaped electrodes facing each other, for example, and is driven according to a signal from a deflection-signal generating circuit 104.

During pattern drawing, the wafer 137 continuously moves together with a stage 139 in an X direction (direction perpendicular to the paper plane of FIG. 1). In parallel with that, based on the result of the real-time measurement of the position of the stage 139 by a laser length measuring machine, an electron beams 138 on the wafer is deflected in a Y direction (left and right on the paper plane of FIG. 1) by the deflector array 132. Further, each electron beam is blanked according to a pattern to be drawn by the blanker array 128. In this way, it is possible to draw a pattern on the wafer 137 at high speed.

An electron optical system includes an irradiation optical system 170 (irradiation system) and a projection optical system 180 (projection system). The irradiation optical system 170 includes an optical system 150 for generating multiple electron beams (a system for generating multiple electron beams), the collimator lens 113, and a correction optical system 160 (a correcting system).

The optical system 150 for generating multiple electron beams includes the electron source 107, the pre-aperture array 109, the pre-converging lens array 111, and the collimator lens 113, and generates multiple electron beams. Further, the correction optical system 160 includes electron optical elements between the collimator lens 113 and the projection aperture array 126, and corrects amounts of angular deviations of principal ray groups of the multiple electron beams attributable to the spherical aberration of the collimator lens 113 and the space-charge effect. Furthermore, the projection optical system 180 is disposed after the projection aperture array 126, and reduces and projects images of the aperture groups of the projection aperture array 126. The present exemplary embodiment mainly relates to a configuration of the irradiation optical system 170.

FIGS. 2A to 2F are diagrams illustrating aperture arrangements of the pre-aperture array, the pre-converging lens array, the second aperture array, the correction lens array, and the magnifying lens array, and the arrangement of the crossover formed on the refracting surface 114 and the stop aperture array 133. As illustrated in FIGS. 2A and 2B, an aperture arrangement 110 of the pre-aperture array and an aperture arrangement 112 of the pre-converging lens array deviate from aperture arrangements 201 and 202 in a case where the irradiation optical system has no aberration, respectively. The aberration of the irradiation optical system includes spherical aberration of the collimator lens 113 and aberration based on the space-charge effect (which can be considered as negative spherical aberration by a virtual concave lens). Due to the aberration of the irradiation optical system, the principal rays of the multiple electron beams refracted by the collimator lens 113 are not completely parallelized, and have non-uniformity in which the principal rays are inclined more greatly as the electron beams go more outward.

For example, in a case where the spherical aberration of the collimator lens 113 is dominant, in the principal rays of the multiple electron beams, non-uniformity in which the principal rays are more greatly inclined inwardly as the electron beams go more outward occurs. In contrast, in a case where the aberration attributable to the space-charge effect is dominant, in the principal rays of the multiple electron beams, non-uniformity in which the principal rays are more greatly inclined outwardly as the electron beams go more outward occurs.

The shift amounts of the aperture arrangement 110 of the pre-aperture array and an aperture arrangement 112 of the pre-converging lens array are determined according to the above-mentioned aberration, and may be typically set according to a polynomial (function) of 3rd-order with respect to an image height. Also, the shift amounts may be set according to a polynomial obtained by adding a first-order term (defocus term) with respect to the image height to a third-order term (term with respect to the spherical aberration and the space-charge effect) with respect to the image height. FIGS. 2A to 2F illustrate cases where the position of each aperture has been shifted by an amount according to a 3rd-order polynomial which does not include a defocus term. The details of the aperture arrangements in a case where defocus adjustment is made will be described below with reference to FIGS. 5A to 5C. In FIGS. 2A to 2F, the aperture arrangements in a case where the irradiation system has no aberration are square lattice arrangements. However, they may be arrangements having other regularity, such as a checkerboard arrangement and a multi-stage checkerboard arrangement.

The aperture arrangement 110 of the pre-aperture array and the aperture arrangement 112 of the pre-converging lens array define an arrangement of crossovers 115 (a plurality of first crossovers) to be formed on the rear-side refracting surface 114, that is, an arrangement of the multiple electron beams. Therefore, it is possible to change the arrangement of the crossovers 115 to be formed on the refracting surface 114 by changing the aperture arrangement 110 of the pre-aperture array and the aperture arrangement 112 of the pre-converging lens array. One feature (first feature) of the present exemplary embodiment is that the arrangement of the crossovers to be formed on the refracting surface 114 is set according to an amount of aberration of the irradiation system. This will be described below in detail.

In the present exemplary embodiment, an aperture arrangement 118 of the second aperture array and an aperture arrangement 120 of the correction lens array in the correction optical system 160 also deviate from aperture arrangements when the irradiation system has no aberration. This state is illustrated in FIG. 2D. Here, since the aperture arrangements when the irradiation system has no aberration coincide with an aperture arrangement 134 of the stop aperture array on a rear portion, it can be said that the aperture arrangements of the second aperture array and the correction lens array deviate from the aperture arrangement 134 of the stop aperture array. Similar to the cases of the pre-aperture array and the pre-converging lens array, the aperture arrangement 118 of the second aperture array and the aperture arrangement 120 of the correction lens array deviate by amounts of deviation set according to the aberration of the irradiation system by a polynomial of 3rd-order with respect to the image height, for example. Also, the amounts of deviation of the aperture arrangement 118 of the second aperture array and the aperture arrangement 120 of the correction lens array may be set to the same amount for apertures corresponding to each other, as illustrated in FIG. 2D. In other words, apertures corresponding to each other in the second aperture array and the correction lens array may be shifted while maintaining coaxiality. Here, the same amount or the coaxiality includes even a case where amounts and axes deviate from each other within an allowable range set from the accuracy required of the drawing apparatus.

If the second aperture array and the correction lens array are configured such that apertures corresponding to each other becomes coaxial as described above, the second aperture array 117 is disposed on the front focal plane of the correction lens array 119 such that the principal rays of the multiple electron beams are parallelized with respect to one another. The reason is that the centers of the apertures 118 of the second aperture array coincide with front focal points of the correction lens array 119. In other words, since the principal ray groups of the multiple electron beams defined by the second aperture array 117 pass through corresponding front focal points of the correction lens array 119, respectively, the principal rays are parallelized. In this way, principal rays 116 in FIG. 1 inclined due to the aberration of the irradiation system are subject to inclination correction by the second aperture array 117 and the correction lens array 119 to become principal rays 121. Another feature (second feature) of the present exemplary embodiment is that the optical system (optical element) configured to correct the angular deviation of principal rays attributable to aberration of irradiation is provided.

Here, from the viewpoint of a principle correcting the angular deviation of principal rays, it is not essential to shift the apertures 118 of the second aperture array and the apertures 120 of the correction lens array while maintaining the coaxiality. However, in a case where the corresponding correction is performed without shifting the aperture 118 of the second aperture array and the apertures 120 of the correction lens array, current loss attributable to reflection of the electron beams by the second aperture array, that is, a reduction in an aperture ratio may become an issue. Particularly, in a case where the amounts of angular deviation of the principal rays by the irradiation system have values equal to or greater than convergent angles of the crossovers 115 formed on the refracting surface 114, the reduction in the aperture ratio becomes marked. Also, in a case where the amounts of angular deviation of the principal rays attributable to the aberration of the irradiation optical system are very large, a situation in which the electron beams enter some apertures of the second aperture array may occur. Therefore, in a case where the amounts of angular deviation of the principal rays attributable to the aberration of the irradiation optical system are equal to or greater than the convergent angles of the crossovers 115 formed on the refracting surface 114, it is necessary that the apertures of the second aperture array 117 and the correction lens array 119 are shifted while maintaining the coaxiality with each other.

Further, the reason why it is useful to determine the shift amounts of the aperture 118 of the second aperture array and the apertures 120 of the correction lens array according to the amount of aberration of the irradiation optical system by the polynomial of 3rd-order with respect to the image height will also be described below from the viewpoint of the aperture ratio.

First, the aperture ratio of the second aperture array 117 becomes the largest in a case where the principal rays 116 inclined due to the aberration of the irradiation system pass through the centers of the apertures of the second aperture array 117. Meanwhile, the amounts of angular deviation attributable to the aberration of the irradiation system are expressed as a polynomial of 3rd-order with respect to the image height. Therefore, if the apertures of the second aperture array 117 are shifted according to the polynomial of 3rd-order with respect to the image height, the individual principal rays 116 inclined due to the aberration of the irradiation system pass through the centers of corresponding apertures of the second aperture array 117. In this case, the aperture ratio becomes the largest. This can be clearly seen from an aperture 118 of an outside area (having a large image height) of the aperture array and a corresponding principal ray 116 in FIG. 1, for example. In other words, in FIG. 1, the apertures 118 of the second aperture array are shifted to the positions where the principal rays 116 inclined due to the aberration of the irradiation system pass through the centers of the apertures 118. The shift amounts are set according to the aberration of the irradiation system by a polynomial of 3rd-order with respect to the image height. The apertures 120 of the correction lens array may be shifted only by the same amounts as the shift amounts of the apertures 118 of the aperture array to coincide with the apertures 118 of the second aperture array.

Also, the necessity of shifting the arrangement of the crossovers formed on the refracting surface 114 from the arrangement when the irradiation system has no aberration (the first feature of the present exemplary embodiment) can be easily understood if being considered in combination with the optical system configured to correct the angular deviation of the principal rays. That necessity will be described with reference to FIG. 1. If the principal rays of the electron beams are inclined due to the aberration of the irradiation system, the positional deviation of the crossovers occurs. For example, the crossovers 115 formed on the refracting surface 114 and crossovers 123 (a plurality of third crossovers) formed inside the correcting system deviate from each other in an outside area having a large image height. As can be seen from FIG. 1, this deviation occurs because the principal rays are inclined. Here, the crossovers 123 formed inside the correcting system have a conjugate relation with crossovers 135 (a plurality of second crossovers) formed on the stop aperture array 133 by the magnifying lens array 124. Further, the crossovers 135 on the rear side of the correction optical system need to be aligned with the apertures 134 of the stop aperture array. This is because, in a case where the crossovers 135 are not aligned with the apertures 134, the current values and positions of the electron beams on the wafer 137 vary.

In order to align the crossovers 135 formed on a rear portion of the correcting system with the apertures 134 of the stop aperture array, it is necessary to adjust the positions of the crossovers 123 formed inside the correcting system. In order for this adjustment, the aperture arrangements of the pre-aperture array 109 and the pre-converging lens array 111 are shifted such that the arrangement of the crossovers 115 formed on the refracting surface 114 is shifted in advance. In this way, the positions of the crossovers 123 inside the correcting system are adjusted, such that the crossovers 135 on the rear side of the correcting system are aligned with the apertures 134 of the stop aperture array.

From this, it can also be seen the reason why the shift amounts of apertures 110 of the pre-aperture array and apertures 112 of the pre-converging lens array are determined according to the aberration of the irradiation optical system (by a polynomial of 3rd-order with respect to the image height). In other words, the angles of inclination of the principal rays inclined due to the aberration of the irradiation optical system are determined by the polynomial of 3rd-order with respect to the image height. Therefore, in order to align the crossovers 135 on the rear side of the correction optical system with the apertures 134 of the stop aperture array, the crossovers formed on the refracting surface 114 may be shifted according to a polynomial of 3rd-order with respect to the image height.

The two features of the present exemplary embodiment are summarized as follow. The first feature is that the positional deviation of the crossovers 115 attributable to the inclination of the angles of the principal rays is corrected. The second feature is that the corresponding apertures of the aperture array and the lens array are shifted while maintaining the coaxiality such that the inclination of the principal rays is corrected. According to these features, it is possible to compensate for the inclination of the angles of the principal rays attributable to the aberration of the irradiation system, and to align the arrangement of the crossovers on the stop aperture array 133 with the arrangement of the apertures 134 of the stop aperture array.

Figure 3A:
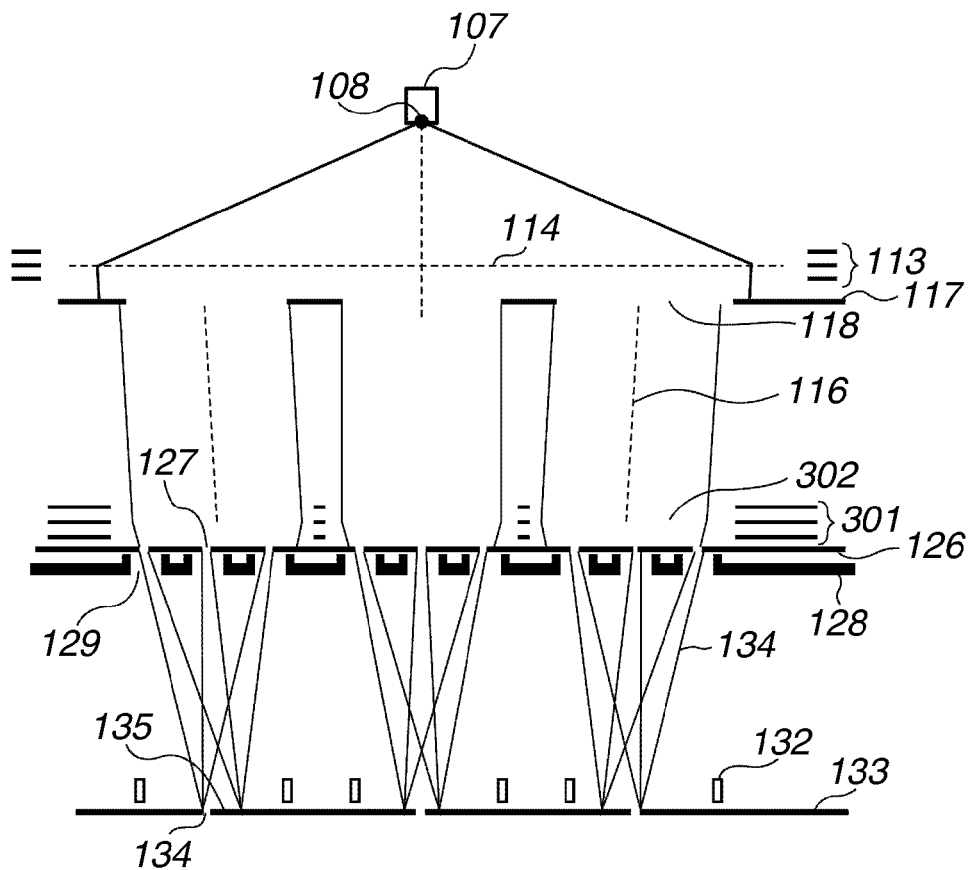
FIGS. 3A, 3B, and 3C are diagrams illustrating aperture arrangements of an aperture array and a converging lens array, and a beam arrangement on an imaging plane in a case where irradiation angles of charged particle beams are non-uniform.
Figure 3B:
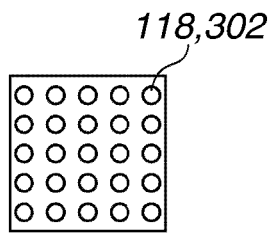
Figure 3C:
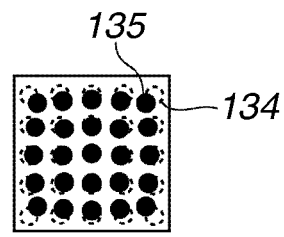

Subsequently, a difference in a correction residual of the inclination of the principal rays between a case where the configuration of the present exemplary embodiment is used and a case where the configuration of the present exemplary embodiment is not used will be described with reference to FIGS. 3A to 3C and FIG. 4. FIGS. 3A to 3C are diagrams illustrating the aperture arrangements of the aperture array and the converging lens array, and an arrangement of the electron beams on an imaging plane when the configuration of the present exemplary embodiment is not used. FIG. 3A illustrates the configuration from the electron source 107 to the stop aperture array 133, and does not illustrate the other parts because the other parts are common to the configuration of the present exemplary embodiment. In FIG. 3A, the electron beams radiating from the electron source 107 are parallelized directly through the collimator lens 113 without passing through the pre-aperture array 109 and the pre-converging lens array 111. After the parallelization is performed by the collimator lens 113, multiple electron beams generated by an aperture array 117 form the plurality of crossovers 135 on the stop aperture array 133 by a converging lens array 301. The function of the converging lens array 301 is the same as the function of the magnifying lens array 124, and the arrangements and functions of the projection aperture array 126 and the blanker array 128 are also the same as those of the present exemplary embodiment.

In the configuration example illustrated in FIG. 3A, the principal rays of the multiple electron beams are not completely parallelized due to the aberration of the irradiation system (the spherical aberration of the collimator lens 113 and the aberration attributable to the space-charge effect). In FIG. 3A, principal rays 116 inclined due to the aberration of the irradiation system are illustrated. Due to the aberration of the irradiation system, the arrangement of the crossovers 135 formed on the stop aperture array 133 deviates from the arrangement of the apertures 134 of the stop aperture array. FIG. 3C illustrates an example in which due to positive spherical aberration, the positions of the crossovers 135 deviate further more inwardly as the electron beams go more outward. As a result, the electron beams on the wafer become non-uniform in positional deviation and current. Therefore, it is useful to correct the angular deviation of the principal rays attributable to the aberration of the irradiation system. However, actually, it is necessary to take notice of a variation in the angles of electron beams inside one aperture (correction residual inside the same aperture).

Figure 4:
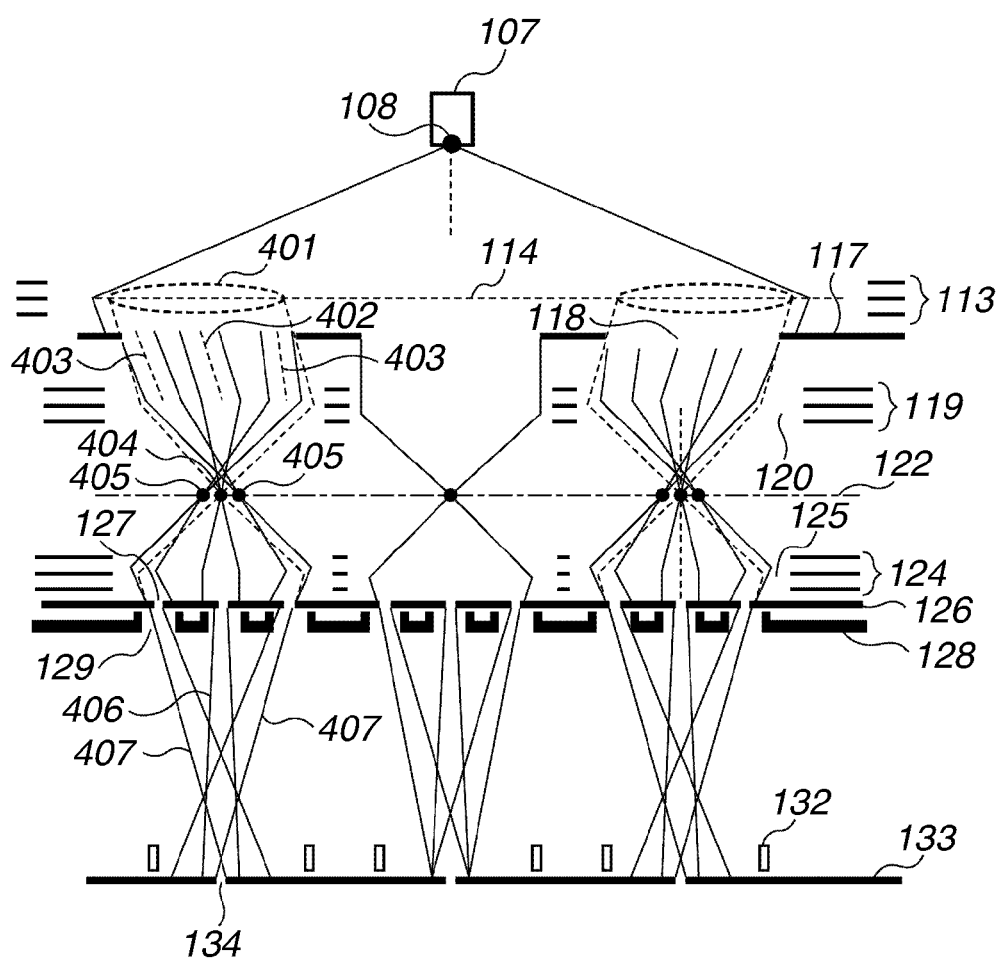
FIG. 4 is a diagram illustrating a correction residual in one charged particle beam in a case where angles of charged particle beams have been corrected by shifting the aperture arrangements of the aperture array and a converging lens array.

FIG. 4 is a diagram illustrating an issue of "the correction residual inside the same aperture" in the case of attempting correction on the angles of the electron beams by shifting the aperture arrangements of the aperture array and the converging lens array with respect to the configuration example illustrated in FIG. 3A. The configuration illustrated in FIG. 4 is different from the configuration illustrated in FIG. 3A in that a correction lens array 119 configured to correct the angular deviation of principal rays attributable to the aberration of the irradiation system is added. A principle of correction on the angular deviation of the principal rays by the correction lens array 119 is the same as the above-mentioned principle. In other words, the angular deviation of the principal rays attributable to the aberration of the irradiation system is corrected by shifting the apertures 118 of the aperture array and the apertures 120 of the correction lens array by the same amount according to the 3-order polynomial.

However, since the correction method is a method of performing correction in units of the apertures of the aperture array 117 and the correction lens array 119, it is impossible to correct local angular deviation inside the same aperture. Like the configuration examples illustrated in FIGS. 3A and 4, at the refracting surface 114 of the collimator lens, the amount of aberration of the irradiation system is expressed by a 3rd-order polynomial. Therefore, the amount of angular deviation of the (virtual) principal ray inside the same aperture varies, and this variation becomes a theoretical correction residual. The variation in the amount of deviation inside the same aperture becomes larger as the diameter of the aperture increases, and causes an unacceptable correction residual in some electron optical systems.

In FIG. 4, amounts of angular deviation of principal rays in a refraction area 401 of the refracting surface 114 corresponding to one aperture of the aperture array 117 are different. This can be easily seen, considering partial electron beams inside an aperture of the aperture array. In other words, in FIG. 4, an angle 402 of a principal ray of a partial electron beam passing through the center of an aperture 118 of the aperture array, and an angle 403 of a principal ray of a partial electron beam passing through an outer area inside an aperture 302 correspond to different image heights and thus are different from each other. Also, FIG. 4 exaggeratingly illustrates the correction residual inside the same aperture to help with understanding. Due to this correction residual, the partial electron beam passing through the center of the aperture 302 of the aperture array, and the partial electron beam passing through the outer area inside of the aperture 302 reach different positions on the stop aperture array 133. This represents that a reach position on the stop aperture array 133 varies for each electron beam of the multiple sub electron beams 131.

For example, the correction according to the shift of the apertures of the aperture array and the converging lens array is performed based on the central apertures of the aperture groups corresponding to the multiple sub electron beams. In this case, as illustrated in FIG. 4, the central electron beams of the multiple (3-by-3) sub electron beams are aligned with the apertures 134 of the stop aperture array, but the other electron beams are not aligned. In other words, in the configuration example illustrated in FIG. 4, because of the above-mentioned theoretical correction residual, in an electron optical system in which unit apertures (118) of an aperture array 117 are large, it is impossible to form allowable crossovers on the stop aperture array 133.

In contrast, the configuration according to the present exemplary embodiment is advantageous in that the above-mentioned correction residual inside the same aperture is small. This point will be described below. In the present exemplary embodiment, the electron beam is split and converged by the pre-aperture array 109 and the pre-converging lens array 111 on the front side of the collimator lens 113. Further, each of the converged multiple electron beams forms a crossover on the refracting surface 114 of the collimator lens 113. In other words, each of the multiple electron beams is refracted at the crossovers by the collimator lens 113. In a case where the multiple electron beams having formed the crossovers are refracted by the refracting surface 114, since electron beams locally exist for each crossover, a variation in the angle of each principal ray determined for the same crossover as an image height function is reduced. This variation in the amount of angular deviation of the principal ray is determined according to the size of the crossover, and can be fit within an allowable range by reducing the corresponding size. For the above-mentioned reasons, a configuration in which crossovers of multiple electron beams are formed on a refracting surface 114 of a collimator lens like the present exemplary embodiment is advantageous in reducing a correction residual of angle deviation of a principal ray inside the same aperture.

However, it should be noted that the configuration in which the crossovers of the multiple electron beams are formed on the refracting surface 114 of the collimator lens is not enough. In other words, in order to align the crossovers 135 with the apertures 134 of the stop aperture array during correction on the angular deviation of the principal rays attributable to the aberration of the irradiation system, it is necessary to use a configuration like the present exemplary embodiment. Therefore, in a case where the correction residual of the angle deviation of each principal ray becomes an issue, it is advantageous to use the configuration according to the present exemplary embodiment.

Subsequently, the shift amounts of the aperture array and the lens array will be described in detail. The shift amounts of the apertures 110 of the pre-aperture array and the apertures 112 of the pre-converging lens array, and the shift amounts of the apertures 118 of the second aperture array and the apertures 120 of the correction lens array are generally different from each other. However, both of them are proportional to the amounts A of angle deviation of the electron beams attributable to the aberration of the irradiation system. Therefore, how to determine the amount $\Delta\theta$ of angle deviation of an electron beam attributable to the aberration of the irradiation system will be described here. Also, a case of shifting the apertures 118 of the second aperture array and the apertures 120 of the correction lens array will be described.

The amount $\Delta\theta$ of angle deviation of the electron beam attributable to the aberration of the irradiation system is expressed by a polynomial of 3rd-order with respect to the image height. Specifically, the amount $\Delta\theta$ of angle deviation can be approximately expressed as $\Delta\theta = Cs(Y/f)^3 + \Delta f(Y/f)$. In the above-mentioned equation, Y represents a distance of the electron beam on the stop aperture array 133 from the center of the stop aperture array (image height), Cs represents a spherical aberration coefficient of the irradiation system, f represents a focal length of the collimator lens, and $\Delta f$ represents an amount of defocus adjustment of the collimator lens 113. Here, the spherical aberration coefficient Cs of the irradiation system can be expressed by Equation "Cs=Cs(CL)+ Cs(Coulomb)". Cs(CL) represents a spherical aberration coefficient of the collimator lens, and Cs (Coulomb) represents a spherical aberration coefficient (corresponding to a spherical aberration coefficient of a specific concave lens) based on the space-charge effect. $\Delta\theta$ is approximately expressed by the above-mentioned equation, and the aperture arrangements of the aperture array and the lens array are determined corresponding to $\Delta\theta$.

FIGS. 5A to 5C are diagrams illustrating a difference in the aperture arrangements of the second aperture array and the correction lens array between a case where defocus adjustment of the collimator lens is made and a case where defocus adjustment of the collimator lens is not made. FIG. 5A illustrates the aperture arrangement 118 of the second aperture array and the aperture arrangement 120 of the correction lens array when the amount $\Delta f$ of defocus adjustment is 0 (an amount of defocus is 0). FIG. 5B illustrates the aperture arrangement of the second aperture array and the aperture arrangement of the correction lens array when the defocus adjustment is made (defocusing is made). FIG. 5C is a graph (which illustrates a case where Cs is 5000 mm, f is 500 mm, and $\Delta f$ is 1.5 mm) having a horizontal axis representing the image height (the above-mentioned distance) Y and a vertical axis representing the amount of angle deviation (which is positive in a case where the electron beam is inclined inwardly) attributable to the aberration of the irradiation system.

In FIG. 5C, the amount of angle deviation of the electron beam when the defocus adjustment is not made is proportional to the cube of the image height Y. Therefore, correction is performed by shifting the aperture arrangements of the second aperture array and the correction lens array aperture arrangements by a shift amount proportional to the cube of the image height Y as illustrated in FIG. 5A. Meanwhile, in FIG. 5C, the amount of angle deviation of the electron beam, when the defocus adjustment is made, includes a defocus term proportional to the image height Y in addition to a term proportional to the cube of the image height Y. Therefore, as can be seen from FIG. 5C, the electron beam when the defocus adjustment is made is inclined outwardly in an area where the image height Y is small, and is inclined inwardly in an area where the image height Y is large. Considering this, the correction is performed such that, in the aperture arrangements of the second aperture array and the correction lens array, as illustrated in FIG. 5B, apertures 501 in an area where the image height Y is small are shifted inwardly with respect to a predetermined beam arrangement on the imaging plane and apertures 502 in an area where the image height Y is large are shifted outwardly with respect to the predetermined beam arrangement.

As described above, when the defocus adjustment is made, the aperture arrangement pattern becomes slightly complicated. However, as apparent from the graph of FIG. 5C, a range of the absolute value of the amount of angle deviation when the defocus adjustment is made becomes relatively small. Therefore, the case where the defocus adjustment is made has an advantage that it is possible to reduce the shift amounts of the aperture array and the converging lens array. This can be well understood by comparison between FIGS. 5A and 5B.

As described above, each of a case where the defocus adjustment is made and a case where the defocus adjustment is not made has advantages and disadvantages. Further, in all exemplary embodiments of the present invention, the patterns of the aperture arrangements of the second aperture array and the correction lens array may be changed by the defocus adjustment. Also, the patterns of the aperture arrangements illustrated in the exemplary embodiments are merely illustrative, and any arrangement patterns capable of compensating for non-uniformity of the angles of the electron beams attributable to the aberration of the irradiation system are within the scope of the present invention.

The shift amounts of the pre-aperture array 109 and the pre-converging lens array 111 may be determined, for example, based on the aperture arrangements of the second aperture array and the correction lens array determined as described above. In other words, the shift amounts of the apertures 110 of the pre-aperture array and the apertures 112 of the pre-converging lens array may be determined such that the principal rays of the electron beams from the crossovers formed by the pre-converging lens array pass through the centers of corresponding apertures of the second aperture array. Also, the method of determining the shift amounts of the apertures 110 of the pre-aperture array and the apertures 112 of the pre-converging lens array and the shift amounts of the apertures 118 of the second aperture array and the apertures 120 of the correction lens array is not limited to the above-mentioned method. In other words, those shift amounts may be appropriately determined such that correction on the angle deviation of the principal ray of each electron beam and correction on the arrangement of the crossovers are made.

Figure 6:
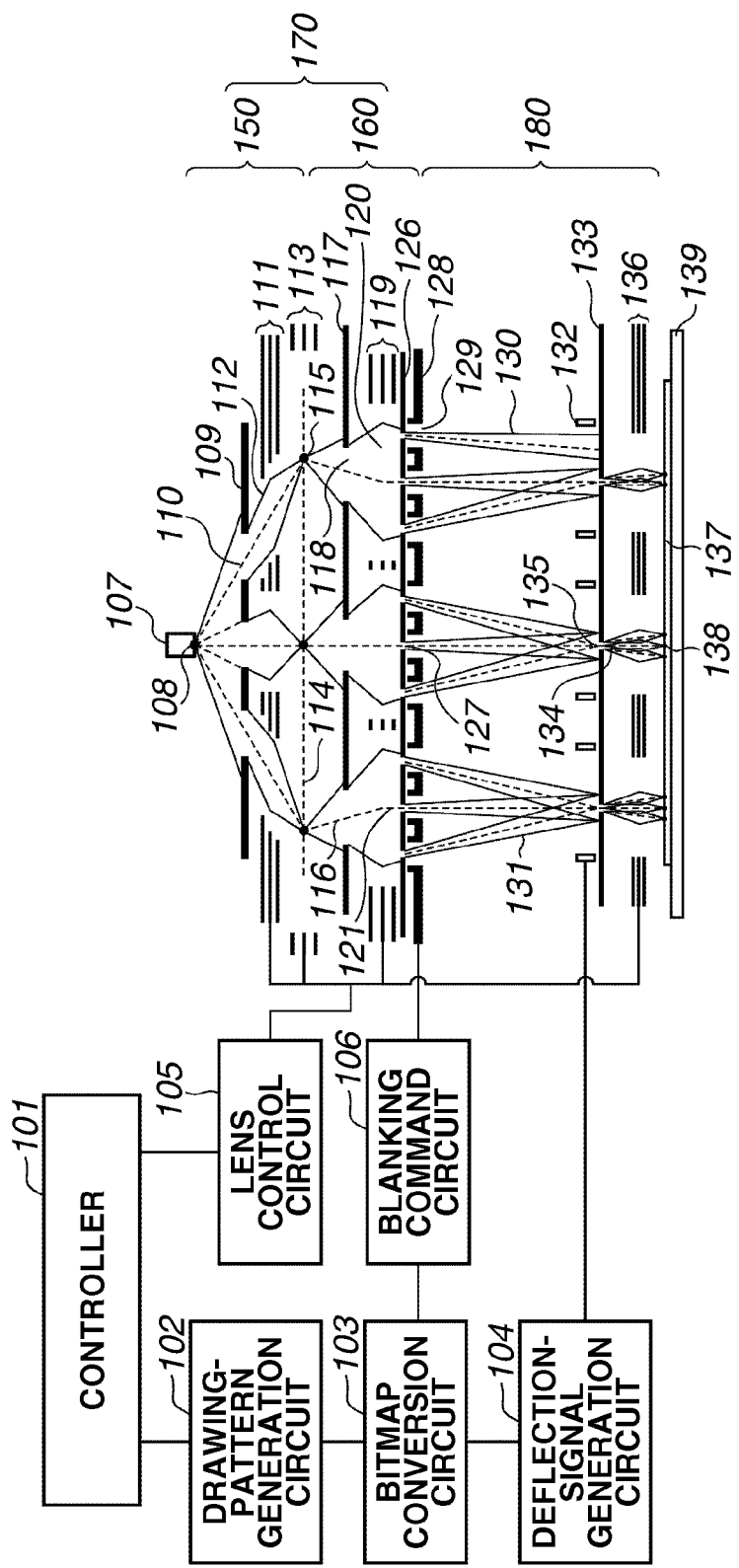
FIG. 6 is a diagram illustrating a configuration of a drawing apparatus according to a second exemplary embodiment.

FIG. 6 is a diagram illustrating a configuration of a drawing apparatus according to a second exemplary embodiment. The configuration of the second exemplary embodiment is different from the configuration of the first exemplary embodiment in that the lens array in the correcting system 160 has a one-stage configuration including only the correction lens array 119, not a two-stage configuration including the correction lens array 119 and the magnifying lens array 124. The correction optical system 160 is not necessarily configured in two stages like the first exemplary embodiment, and can be configured in one stage like the present exemplary embodiment. In other words, as described in the first exemplary embodiment, both of the apertures 118 of the second aperture array and the apertures 120 of the correction lens array are shifted by the same amount, such that the angle deviation of the principal rays is corrected. Further, the lens power of the correction lens array 119 may be set such that the multiple electron beams are converged onto the stop aperture array 133. In this way, the amounts of angle deviation of the principal rays can be corrected by the one-stage configuration including the correction lens array 119, such that the crossovers of the multiple electron beams are formed on the stop aperture array 133.

Figure 7A:
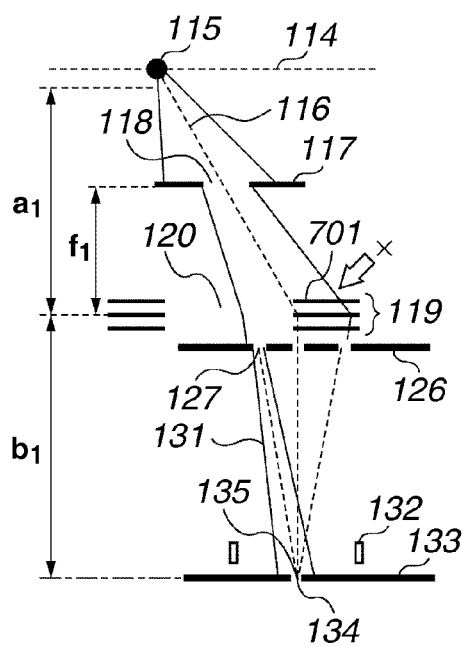
FIGS. 7A and 7B are diagrams illustrating improvement in correction limit in a case where a correction optical system is composed of tandem lens arrays in the first and second exemplary embodiments.
Figure 7B:
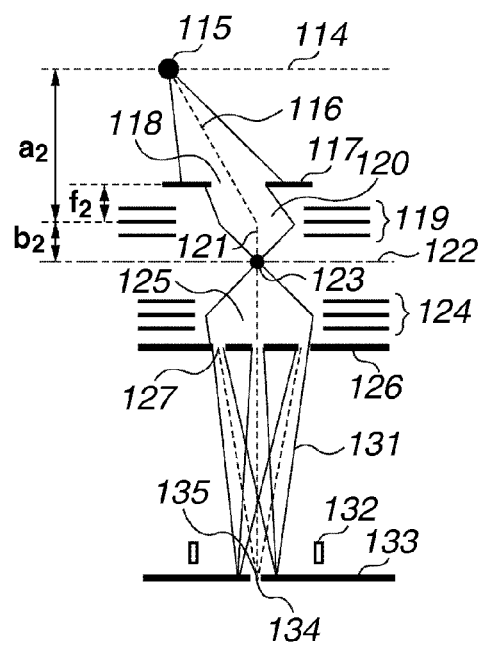

However, as illustrated in FIGS. 7A and 7B, in the configuration of the second exemplary embodiment, in a case where the aberration of the irradiation system is large, correction on the amounts of angle deviation of the principal rays becomes difficult. This point will be described below in detail. FIGS. 7A and 7B are diagrams illustrating a case where the correcting system is composed of tandem (two-stage) lens arrays to improve limits of correction on the amounts of angle deviation of the principal rays. FIG. 7A illustrates a configuration including a one-stage lens array like the second exemplary embodiment, and FIG. 7B illustrates a configuration including two-stage lens arrays like the first exemplary embodiment. As can be seen from FIGS. 7A and 7B, in the case of the configuration including the tandem lens arrays, even when the inclination of the angles of the principal rays is large, correction on the inclination is possible. However, in the case of the configuration including the one-stage lens array, the electron beams are reflected by the correction lens array 119, such that the correction is not made. Like this, correction on the inclination has a limit determined by the reflection of the electron beams by the correction lens array 119. FIGS. 7A and 7B illustrate the case where the correcting system is composed of the tandem lens arrays to improve limits of correction. The way how the limits of the correction are improved by the configuration including the tandem lens arrays will be described below.

According to the correction method, the correction limits attributable to the correcting system are further improved as the focal length of the correction lens array 119 (that is, the distance between the second aperture array 117 and the correction lens array 119) decreases. This is because whether to reflect light fluxes having passed through the apertures 118 of the second aperture array by the correction lens array 119 is determined according to the angles of inclination of the electron beams, and the distance between the second aperture array 117 and the correction lens array 119. Here, it is assumed that the apertures 118 of the second aperture array and the apertures 120 of the correction lens array are shifted by the same amount.

Therefore, in a case where it is desired to improve the correction limits, even if it is desired to reduce the focal length of the correction lens array 119, in the case of the configuration including the one-stage lens array, it is difficult to reduce the focal length of the correction lens array 119. This is because the focal length f is determined by lens formula "$1/a+1/b=1/f$" (wherein "a" represents a distance between a lens and an object plane, and "b" represents a distance between the lens and an imaging plane), but it is difficult to reduce both of "a" and "b" due to their limits (if both of "a" and "b" are large, the focal length f is also large from the above-mentioned formula). Here, the value "b" is restricted by the projection system 180. For example, if the magnification of the projection system configured to reduce and project the projection aperture array 126 is set to $1/100$ times, and the focal length of the objective lens array 136 is set to 400 µm, a value of "b1" illustrated in FIG. 7A should be set to about 400 mm, which is 100 times 400 µm. Further, since the crossovers 115 are formed on or near the principal plane (refracting surface 114) of the collimator lens and physically interfere with the collimator lens, it is difficult to reduce a value of "a1" illustrated in FIG. 7A. As described above, in the case of the configuration including the one-stage lens array, the focal length f1 of the correction lens array 119 (that is, the distance between the second aperture array 117 and the correction lens array 119) becomes long like the configuration of FIG. 7A. As a result, correction limit values of the angles of inclination of the principal rays are small, and correction beyond the corresponding limit values cannot be made.

Meanwhile, in the configuration including the tandem lens arrays, as can be seen from FIG. 7B, since a value of "b2" has no limits, unlike the value of "b1", it is possible to reduce the focal length f2 of the correction lens array 119. Here, the correction lens array 119 becomes a reducing lens array. For this reason, the magnifying lens array 124 configured to magnify and project the crossovers formed by the correction lens array 119 onto the stop aperture array 133 such that crossovers are formed performs adjustment to magnify the diameters of the crossovers.

As described above, in the case of the configuration including the one-stage lens array, because of the limits of the electron optical system, it is impossible to reduce the focal length of the correction lens array; whereas in the case of the configuration including the tandem lens arrays, it is possible to reduce the focal length of the correction lens array. Therefore, the configuration including the tandem lens arrays can be used to improve the correction limits related to the inclination of the principal rays.

From the above description, considering that the above-mentioned correction limit values are small, the configuration according to the second exemplary embodiment can be applied to a case where the angles of inclination of the principal rays attributable to the aberration of the irradiation system are relatively small. If it is desired to increase the correction limit values, the configuration including the tandem lens arrays according to the first exemplary embodiment can be used.

Figure 8:
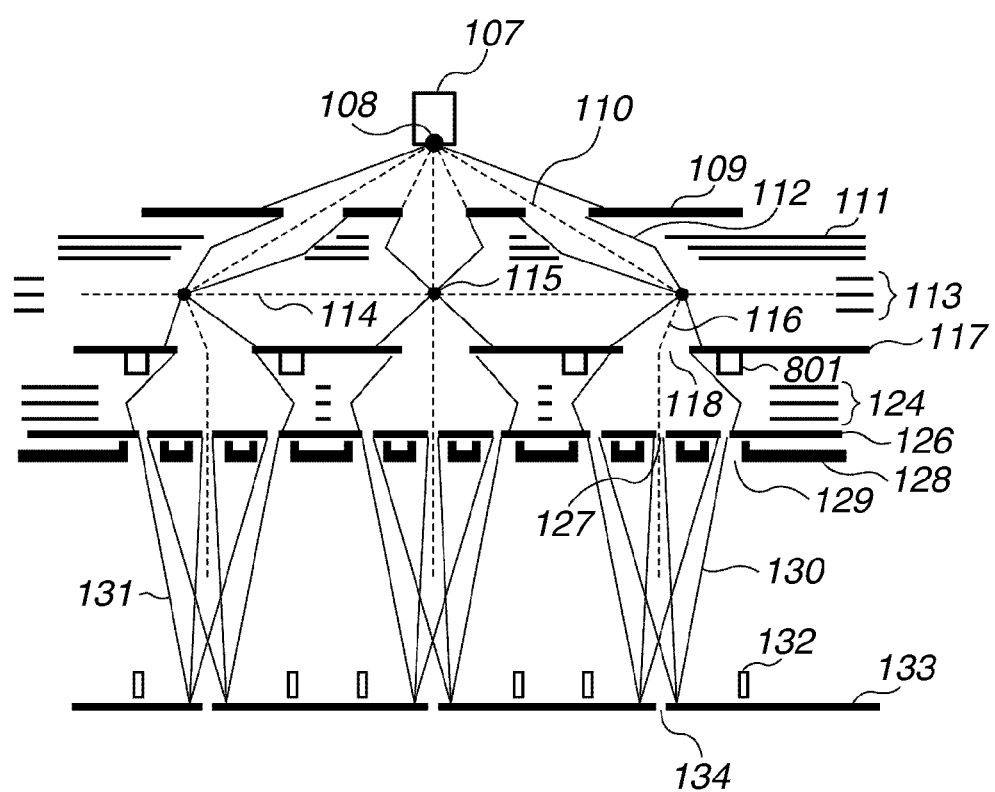
FIG. 8 is a diagram illustrating a configuration of a drawing apparatus according to a third exemplary embodiment.

FIG. 8 is a diagram illustrating a configuration of a drawing apparatus according to a third exemplary embodiment. The third exemplary embodiment is different from the first exemplary embodiment in that, instead of the correction lens array 119, separate deflectors 801 (correction deflector array) are disposed immediately below the second aperture array 117. Referring to FIG. 8, the angles of the principal rays 116 inclined due to the aberration of the irradiation system are adjusted by the separate deflectors 801. Here, the separate deflectors 801 include a plurality of deflectors (pairs of electrodes) provided for each of the multiple electron beams, and correct the angle deviation of the principal rays if a voltage is separately applied. It is apparent that the separate deflectors 801 can also correct the angle deviation of the principal rays of the multiple electron beams attributable to the aberration of the irradiation system.

Here, an important point is that even in a case where the angle deviation of the principal rays of the multiple electron beams is corrected by the separate deflectors 801, not by the correction lens array 119, it is necessary to use the above-mentioned first feature. In other words, it is necessary to correct the arrangement of the crossovers 115 on the refracting surface 114 in advance. This is because it is necessary to shift the arrangement of the crossovers 115 on the refracting surface 114 with respect to the arrangement of the crossovers 135 on the stop aperture array 133, as can be seen from FIG. 8. This shift amount is determined according to a distance between the refracting surface 114 of the collimator lens 113 and the separate deflectors 801, and the angles of inclination of the principal rays. In a case where the collimator lens 113 is an electrostatic lens, it is impossible to dispose the separate deflectors 801 inside the collimator lens 113. For this reason, the distance between the refracting surface 114 and the separate deflectors 801 cannot be set to zero. This is like it is impossible to dispose the correction lens array 119 inside the collimator lens 113 in the first and second exemplary embodiments. Like this, even in the third exemplary embodiment, it is necessary to shift the arrangement of the crossovers 115 on the refracting surface 114 in advance. A configuration for the shifting is similar to the cases of the first and second exemplary embodiments. In other words, the arrangements of the apertures 110 of the pre-aperture array and the apertures 112 of the pre-converging lens array are shifted according to the aberration of the irradiation system. According to this configuration, the arrangement of the crossovers 115 on the refracting surface 114 deviates from the arrangement of the apertures 134 of the stop aperture array. The shift amount is determined such that the arrangement of the crossovers 135 formed on the stop aperture array through the separate deflectors 801 is aligned with the arrangement of the apertures 134 of the stop aperture array.

Figure 9:
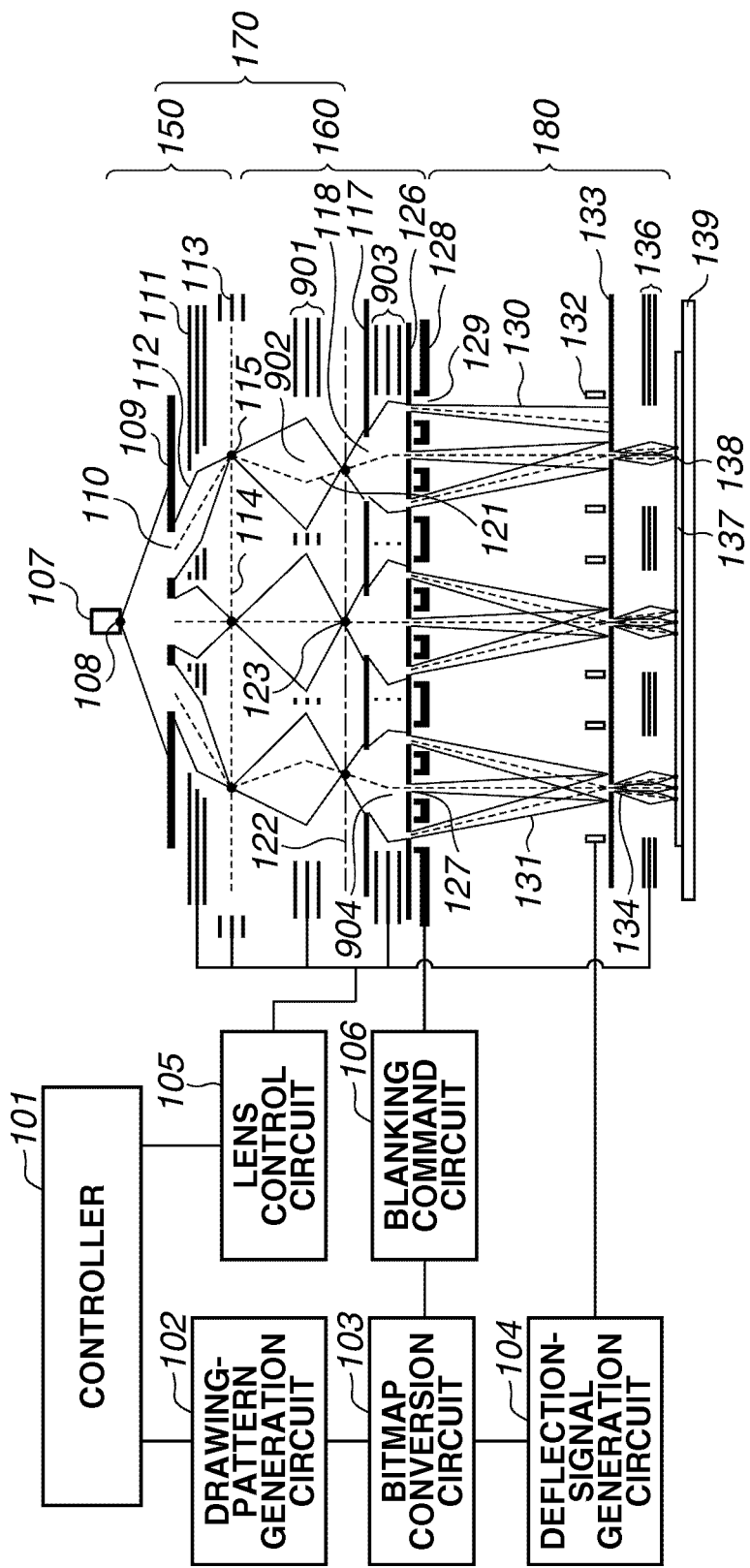
FIG. 9 is a diagram illustrating a configuration of a drawing apparatus according to a fourth exemplary embodiment.

FIG. 9 is a diagram illustrating a configuration of a drawing apparatus according to a fourth exemplary embodiment. The fourth exemplary embodiment is different from the first exemplary embodiment in that the arrangement of the apertures 110 of the pre-aperture array and the arrangement of the apertures 112 of the pre-converging lens array are not shifted, and in the configuration of the correction optical system 160.

In the third exemplary embodiment, the arrangement of the apertures 110 of the pre-aperture array and the arrangement of the apertures 112 of the pre-converging lens array are not shifted. For this reason, in a configuration of the correction optical system 160 similar to the first exemplary embodiment, on the stop aperture array 133, the crossovers 135 are not aligned with the apertures 134. Therefore, in the third exemplary embodiment, the correction optical system 160 has not only the function of correcting the angle deviation of the principal rays but also the function of aligning the crossovers 135 with the apertures 134 on the stop aperture array. Specifically, the tandem correction lens arrays refracts the principal rays in two stages. In FIG. 9, a state of two-stage refraction by the tandem correction lens arrays is illustrated, and the principal rays inside the correction optical system 160 are illustrated by dotted lines.

FIGS. 10A and 10B are diagrams illustrating a configuration in which the tandem correction lens arrays refract the principal rays in two stages in the fourth exemplary embodiment. FIG. 10A is a diagram illustrating a case where one electron beam is refracted in two stages by the tandem correction lens arrays, and FIG. 10B is a diagram illustrating only a trajectory of the principal ray in FIG. 10A. The correction optical system 160 is configured to include a first correction lens array 901, a second aperture array 117, and a second correction lens array 903. The second aperture array is disposed on the front side of the second correction lens array (the front side of the second-stage lens array of the tandem lens arrays). This is to perform correction on the angle deviation of the principal rays by the second correction lens array 903. In other words, the apertures 118 of the second aperture array and apertures 904 of the second correction lens array are disposed coaxially, such that the principal rays of the electron beams defined by the apertures of the second aperture array are parallelized. In FIG. 10B, the optical axis of the second correction lens array 903 passes through the center of an aperture 118 of the second aperture array. Further, the apertures 118 of the second aperture array and the apertures 904 of the second correction lens array are shifted by the same amount from the viewpoint of the aperture ratio, similar to the first exemplary embodiment.

The second aperture array 117 and the second correction lens array 903 correct the inclination of the principal rays attributable to the aberration of the irradiation system. However, this is not sufficient to align the positions of the crossovers 135 with the positions of the apertures 134 of the stop aperture array, on the stop aperture array 133. This alignment is performed by the first correction lens array 901. Apertures 902 of the first correction lens array deviate from the crossovers 115 on the refracting surface 114 of the collimator lens such that the positions of the crossovers 135 on the stop aperture array are adjusted. For example, in FIG. 10B, the optical axis 1004 of the first correction lens array deviates from a crossover 115 on the refracting surface 114 by Δx. An amount Δy of deviation of the crossover 123 on an intermediate imaging plane inside the correcting system becomes MΔx, wherein M represents the magnification of the first correction lens array. In this way, it is possible to change the positions of the crossovers 123 on the intermediate imaging plane by shifting the apertures 902 of the first correction lens array (by changing Δx). Therefore, it is possible to align the positions of the crossovers 135 with the positions of the apertures 134, on the stop aperture array.

As described above, if the tandem correction lens arrays having the shifted aperture arrangements is used as the correction optical system 160, it is possible to adjust the inclination of the principal rays and the positions of the crossovers on the stop aperture array. A reference for the aperture arrangement of the tandem correction lens arrays may be the arrangement of the apertures 134 of the stop aperture array in the present exemplary embodiment. In other words, a feature of the fourth exemplary embodiment is to include the tandem correction lens arrays having the aperture arrangement deviating from the arrangement of the apertures 134 of the stop aperture array.

The above-mentioned first to fourth exemplary embodiments are based on the electron optical system configured to reduce and project the projection aperture array 126 onto the wafer. In such electron optical system, images conjugated with the virtual crossover 108 of the electron source are the crossovers 135 on the stop aperture array, and these are on the pupil plane of the objective lens array 136. In other words, the electron optical systems illustrated in first to fourth exemplary embodiments use Kohler illuminations.

The electron optical systems illustrated in the first to fourth exemplary embodiments are advantageous in that it is possible to increase the number of multiple electron beams, but is disadvantageous in that the aperture ratio of the entire system is low. The low aperture ratio requires an electron source of a large emission current (emittance). This limits usable electron sources. A thermal field emission (TEF) electron source known as a high-brightness low-energy-spread electron source is disadvantageous in that emittance is high. For this reason, in a case where it is desired to use a TFE electron source, which is a high-brightness light source, an electron optical system having a high aperture ratio is necessary. As this electron optical system, for example, an electron optical system using a critical illumination configured to form images conjugated with crossovers of an electron source on a wafer can be used. The following fifth and sixth exemplary embodiments are based on an electron optical system that has a high aperture ratio and uses a critical illumination for a high-brightness electron source such as a TFE electron source or the like.

FIGS. 11A to 11G are diagrams illustrating a configuration of a drawing apparatus according to the fifth exemplary embodiment. In the present exemplary embodiment, an electron optical system uses a critical illumination configured to form electron source images on a wafer.

Similar to the first exemplary embodiment, an electron beam radiating from an electron source 107 is immediately split into multiple electron beams by a pre-aperture array 109. Here, as the electron source 107, for example, a TFE electron source having ZrO/W or the like on an electron emission surface may be used.

Similar to the first exemplary embodiment, the multiple electron beams emitted from the pre-aperture array 109 pass through the pre-converging lens array 111 and form crossovers on the collimator lens 113. At the rear side, inclination of principal rays attributable to the aberration of the irradiation system is corrected by the correcting system 160, that is, the tandem lens arrays including the correction lens array 119 and the magnifying lens array 124. Here, the lens power of the magnifying lens array 124 is determined such that the crossovers formed by the magnifying lens array 124 are formed on the blanker array 128. Unlike the configuration of the first exemplary embodiment, images (the crossovers 135 formed on the rear side of the correction optical system) conjugated with the crossovers 115 formed on the refracting surface 114 of the collimator lens 113 are formed on the blanker array 128, not on the stop aperture array 133.

Similar to the first exemplary embodiment, the function of the blanker array 128 is to perform blanking on each of the multiple electron beams. If a voltage is applied to a blanker (a pair of electrodes), the electron beam is deflected, and the deflected electron beam is blocked by the stop aperture array 133. In this way, the blanking of the electron beam is made. An electron beam 130 deflected by the blanker array is illustrated in FIG. 11A.

The crossovers 135 (the images conjugated with the virtual crossover 108 of the electron source) formed at the apertures of the blanker array are reduced and projected onto a wafer 137 by the objective lens array 136. Similar to the first exemplary embodiment, the projection magnification is set to 1/100 times, for instance. In this case, if the diameters of the crossovers 135 on the blanker array are 2 μm, the diameters of the crossovers (projection images) formed on the wafer 137 become 20 nm.

Even in the fifth exemplary embodiment, in order for scanning with the multiple electron beams at the same time, a deflector array 132 similar to that of the first exemplary embodiment is provided. Further, in order to align the positions of apertures 129 of the blanker array with the positions of the crossovers 135 on the blanker array 128, an aligner deflector 1102 is provided. The aligner deflector 1102 is a deflector capable of performing two-stage deflection in each of an X direction and a Y direction. The X direction and the Y direction are perpendicular to the direction of the optical axis of the electron optical system and are perpendicular to each other. The aligner deflector can shift all of the multiple electron beams in an arbitrary direction on an X-Y plane. However, the aligner deflector cannot shift all of the multiple electron beams together. Therefore, it is possible to correct the positional deviation of all of the multiple electron beams or the like attributable to, for example, parallel eccentricity of the blanker array 128 or various lens arrays, but it is impossible to make correction requiring shifting the multiple electron beams by different amounts.

Two features of the fifth exemplary embodiment are as follow.

First, a first feature is that the arrangement of the crossovers 115 on the refracting surface 114 of the collimator lens is shifted by shifting the positions of the apertures of the pre-aperture array 109 and the pre-converging lens array 111. Therefore, it is possible to align the arrangement of the crossovers 135 with the arrangement of the apertures 129 of the blanker array, on the blanker array 128.

A second feature is that the apertures of the second aperture array 117 and the correction lens array 119 are shifted by the same amount such that the inclination of the principal rays attributable to the aberration of the irradiation system is corrected. The shift amount of the second aperture array 117 and the correction lens array 119 is determined according to the amount of aberration of the irradiation system such that the aperture ratio becomes maximized (reflection of the electron beams does not occur).

As described above, the first exemplary embodiment and the fifth exemplary embodiment are different from each other in that the first exemplary embodiment aligns the arrangement of the apertures 134 of the stop aperture array with the arrangement of crossovers; whereas the fifth exemplary embodiment aligns the arrangement of the apertures 129 of the blanker array with the arrangement of the crossovers. In other words, the first exemplary embodiment and the fifth exemplary embodiment are different from each other in elements (apertures on elements) which are references for adjusting the arrangement of the crossovers. Both exemplary embodiments have the difference because the basic configurations of the electron optical systems are different, but share the principles and ideas of the present invention.

The fifth exemplary embodiment adjusts the positions of the crossovers by the pre-aperture array 109 and the pre-converging lens array 111. Instead of them, a correction lens array including tandem lens arrays similar to the third exemplary embodiment can be used to adjust the positions of the crossovers. A configuration example of this case will be described as a sixth exemplary embodiment.

Figure 12:
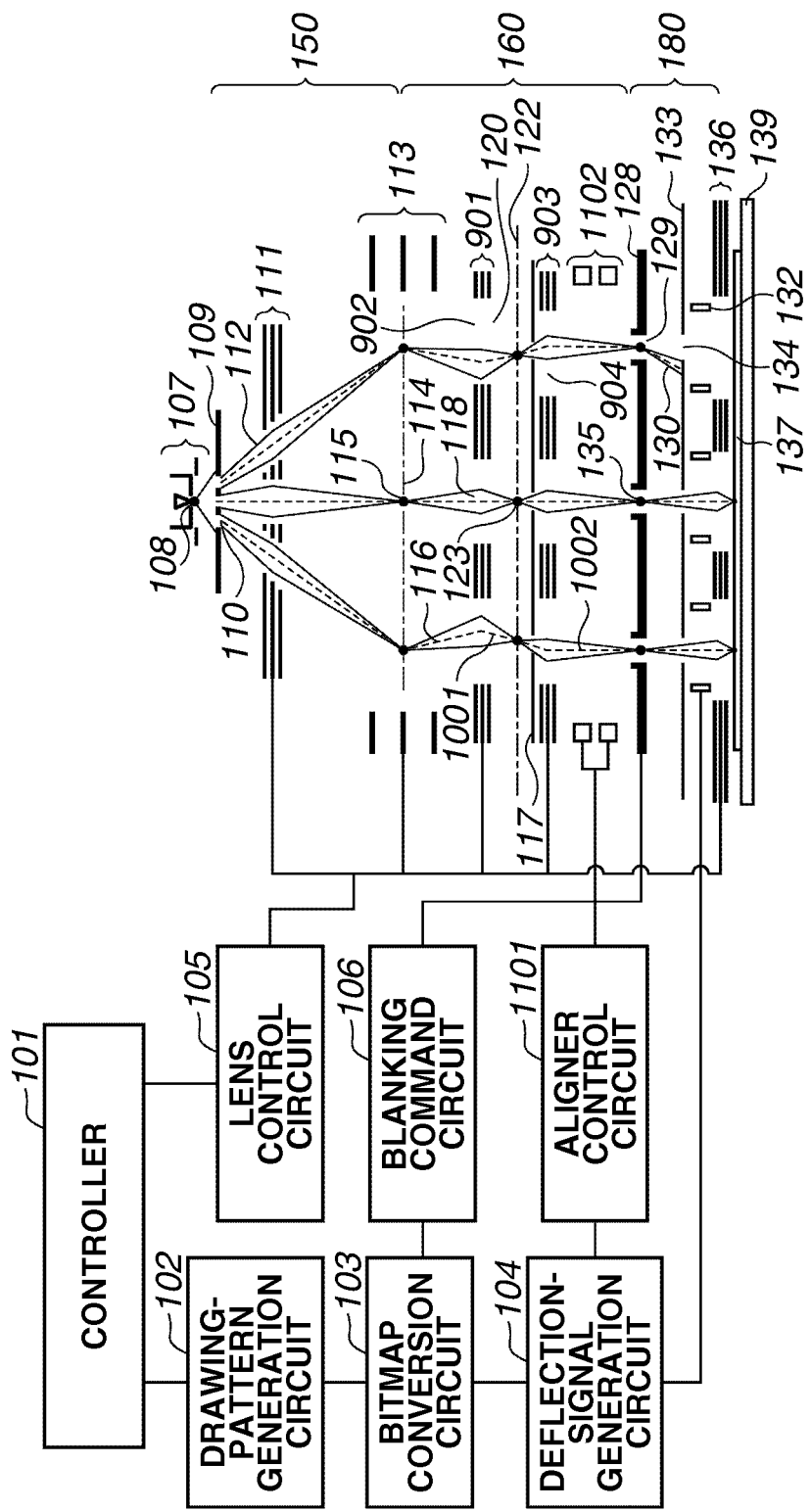
FIG. 12 is a diagram illustrating a configuration of a drawing apparatus according to a sixth exemplary embodiment.

FIG. 12 is a diagram illustrating a configuration of a drawing apparatus according to the sixth exemplary embodiment. The configuration of the sixth exemplary embodiment uses two-stage refraction by the first correction lens array 901 and the second correction lens array 903. The correction on the inclination of the principal rays, and alignment of the arrangement of the apertures 129 with the arrangement of the crossovers on the blanker array 128 are made by the two-stage refraction.

The features of the configuration of the first correction lens array 901 and the second correction lens array 903 and the correction principle are the same as those in the third exemplary embodiment. In other words, the arrangement of the crossovers on the blanker array 128 is adjusted by shifting the apertures 902 of the first correction lens array, and the inclination of the principal rays is corrected by shifting the apertures of the second aperture array 117 and the second correction lens array 903 by the same amount. Unlike this, if the correction optical system 160 is composed of eccentric tandem lens arrays, it is possible to adjust the positions of the crossovers and to correct the angles of the principal rays, without shifting the aperture arrangements of the pre-aperture array and the pre-converging lens array.

A method of manufacturing an article according to an exemplary embodiment of the present invention is suitable for manufacturing articles, for example, micro devices such as semiconductor devices, elements having fine configurations, and the like. The manufacturing method may include a process of forming a latent image pattern on a photosensitive material applied to a substrate by using the above-mentioned drawing apparatus (a process of performing drawing on a substrate), and a process of developing the substrate having the latent image pattern formed thereon. Further, the manufacturing method may include other processes (such as oxidation, film formation, vapor deposition, doping, planarizing, etching, resist removing, dicing, bonding, packaging, and the like). The method of manufacturing an article according to the present exemplary embodiment is advantageous over the related art in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2011-109448 filed May 16, 2011, which is hereby incorporated by reference herein in its entirety.

What is claimed is:

1. A drawing apparatus configured to perform drawing on a substrate with a plurality of charged particle beams, the apparatus comprising:
    a first aperture array configured to split a diverging charged particle beam into a plurality of charged particle beams;
    a converging lens array configured to form a plurality of first crossovers of the plurality of charged particle beams from the first aperture array;
    a collimator lens having a principal plane where the plurality of first crossovers is to be formed;
    a correcting system configured to correct angles of a plurality of charged particle beams from the collimator lens, and to form a plurality of second crossovers; and
    an element in which a plurality of apertures respectively corresponding to the plurality of second crossovers is formed,
    wherein apertures in the first aperture array and converging lenses in the converging lens array are arranged such that an arrangement of the plurality of first crossovers on the principal plane is different from an arrangement of the plurality of apertures, and that the plurality of second crossovers is aligned with the plurality of apertures on the element.

2. The drawing apparatus according to claim 1, wherein each of an aperture in the first aperture array and a converging lens in the converging lens array is eccentric relative to a corresponding aperture of the plurality of apertures by an amount based on a polynomial of 3rd-order with respect to an image height.

3. The drawing apparatus according to claim 1, wherein the correcting system includes a second aperture array configured to define a principal ray of each of the plurality of charged particle beams, and a correction lens array configured to correct an angle of the principal ray of each of the plurality of charged particle beams.

4. The drawing apparatus according to claim 3, wherein each of an aperture in the second aperture array and a correction lens in the correction lens array is eccentric relative to a corresponding aperture of the plurality of apertures by an amount based on a polynomial of 3rd-order with respect to an image height.

5. The drawing apparatus according to claim 3, wherein the correcting system further includes a magnifying lens array configured to magnify and project a plurality of third crossovers formed by the correction lens array.

6. The drawing apparatus according to claim 1, wherein the correcting system includes a second aperture array configured to define a principal ray of each of the plurality of charged particle beams, and a correction deflector array configured to correct an angle of the principal ray of each of the plurality of charged particle beams.

7. The drawing apparatus according to claim 1, wherein the element includes a blanking stop aperture array.

8. The drawing apparatus according to claim 1, wherein the element includes a blanking deflector array.

9. A drawing apparatus configured to perform drawing on a substrate with a plurality of charged particle beams, the apparatus comprising:
    a first aperture array configured to split a diverging charged particle beam into a plurality of charged particle beams;
    a converging lens array configured to form a plurality of first crossovers of the plurality of charged particle beams from the first aperture array;
    a collimator lens having a principal plane where the plurality of first crossovers is to be formed;
    a correcting system configured to correct angles of a plurality of charged particle beams from the collimator lens, and to form a plurality of second crossovers; and
    an element in which a plurality of apertures respectively corresponding to the plurality of second crossovers is formed,
    wherein apertures in the first aperture array and converging lenses in the converging lens array are arranged such that an arrangement of the plurality of first crossovers on the principal plane is different from an arrangement of the plurality of apertures, and the correcting system includes a tandem lens array, and the tandem lens array includes a lens which is eccentric relative to a corresponding aperture of the plurality of apertures such that the plurality of second crossovers is aligned with the plurality of apertures on the element.

10. The drawing apparatus according to claim 9, wherein the element includes a blanking stop aperture array.

11. The drawing apparatus according to claim 9, wherein the element includes a blanking deflector array.

12. A method of manufacturing an article, the method comprising:
    performing drawing on a substrate using a drawing apparatus;
    developing the substrate on which the drawing has been performed; and
    processing the developed substrate to manufacture the article,
    wherein the drawing apparatus is configured to perform drawing on the substrate with a plurality of charged particle beams, the apparatus comprises:
        a first aperture array configured to split a diverging charged particle beam into a plurality of charged particle beams;
        a converging lens array configured to form a plurality of first crossovers of the plurality of charged particle beams from the first aperture array;
        a collimator lens having a principal plane surface where the plurality of first crossovers is to be formed;
        a correcting system configured to correct angles of a plurality of charged particle beams from the collimator lens, and to form a plurality of second crossovers; and
        an element in which a plurality of apertures respectively corresponding to the plurality of second crossovers is formed,
    wherein apertures in the first aperture array and converging lenses in the converging lens array are arranged such that an arrangement of the plurality of first crossovers on the principal plane is different from an arrangement of the plurality of apertures, and that the plurality of second crossovers is aligned with the plurality of apertures on the element.

13. A method of manufacturing an article, the method comprising:
    performing drawing on a substrate using a drawing apparatus;
    developing the substrate on which the drawing has been performed; and
    processing the developed substrate to manufacture the article,
    wherein the drawing apparatus is configured to perform drawing on the substrate with a plurality of charged particle beams, the apparatus comprises:

a first aperture array configured to split a diverging charged particle beam into a plurality of charged particle beams;

a converging lens array configured to form a plurality of first crossovers of the plurality of charged particle beams from the first aperture array;

a collimator lens having a principal plane where the plurality of first crossovers is formed;

a correcting system configured to correct angles of a plurality of charged particle beams from the collimator lens, and to form a plurality of second crossovers; and an element in which a plurality of apertures respectively corresponding to the plurality of second crossovers is formed, wherein apertures in the first aperture array and converging lenses in the converging lens array are arranged such that an arrangement of the plurality of first crossovers on the principal plane is different from an arrangement of the plurality of apertures, and the correcting system includes a tandem lens array, and the tandem lens array includes a lens which is eccentric relative to a corresponding aperture of the plurality of apertures such that the plurality of second crossovers aligned with the plurality of apertures on the element.

* * * * *